United States Patent [19]

Chi et al.

[11] Patent Number: 4,510,016

[45] Date of Patent: Apr. 9, 1985

[54] METHOD OF FABRICATING SUBMICRON SILICON STRUCTURES SUCH AS PERMEABLE BASE TRANSISTORS

[75] Inventors: Jim-Yong Chi, Bedford; Roger P. Holmstrom, Wayland, both of Mass.

[73] Assignee: GTE Laboratories, Waltham, Mass.

[21] Appl. No.: 448,163

[22] Filed: Dec. 9, 1982

[51] Int. Cl.³ .................... H01L 21/306; B44C 1/22; C03C 15/00; C03C 25/06

[52] U.S. Cl. .................... 156/643; 29/576 W; 29/580; 148/187; 156/647; 156/648; 156/651; 156/653; 156/657; 156/659.1; 156/662; 357/15; 427/84

[58] Field of Search ............... 156/647, 651, 653, 657, 156/659.1, 644, 662, 643, 648, 649; 29/580, 576 W; 357/55, 15; 148/1.5, 187; 427/84, 88, 93

[56] References Cited

PUBLICATIONS

Bozler et al., Fabrication and Numerical Simulation of the Permeable Base Transistor, IEEE Transactions on Electron Devices, vol. Ed-27, No. 6, Jun. 1980, pp. 1128-1141.

Snyder et al., Evaluation of the Permeable Base Transistor for Application in Silicon Integrated Logic Circuits, Technical Digest of IEEE International Electron Device Meeting, 1981, pp. 612-615.

IEEE International Electron Device Meeting, Dec. 1982, Silicon Permeable Base Transistors Fabricated with a New Submicron Technique, J. Y. Chi et al.

*Primary Examiner*—William A. Powell
*Attorney, Agent, or Firm*—J. Stephen Yeo

[57] ABSTRACT

Submicron silicon structures are fabricated by repeat oxidation and stripping the walls of a U-groove leaving thin silicon fingers.

This method may be used to fabricate a silicon transistor having an emitter and a collector separated by a channel. The channel is formed in a silicon finger by a Schottky base, which at zero bias pinches off conduction of the channel. A bias voltage on the Schottky base causes conduction. The channel has a very short length making the transistor capable of high frequency operation.

13 Claims, 6 Drawing Figures

METHOD OF FABRICATING SUBMICRON SILICON STRUCTURES SUCH AS PERMEABLE BASE TRANSISTORS

FIELD OF THE INVENTION

This invention pertains to semiconductor devices and, more particularly, is concerned with a method of fabricating submicron silicon structures for permeable base transistors and the like.

BACKGROUND OF THE INVENTION

Permeable base transistors (PBT) made with either GaAs or silicon and having an embedded base grid structure have been proposed.

The PBT structure has at least one electron conduction channel and a metal base which pinches off the conduction channel without any voltage applied to the base. The conduction channel is opened and controlled by applying a forward voltage with respect to the emitter at the metal base. In order to achieve high operation frequency, the length of the channel region which is affected by the applied bias voltage must be as short as possible to have a short electron transit time. To meet this goal, the following criteria should be met:

(1) The doping in the conduction channel has to be high enough to cause a thin depletion region.

(2) Due to the high doping requirements of the first condition, the grid spacing "d" between the base has to be small enough (in the submicron region) to pinch off the channel at zero bias.

(3) The thickness of the metal base region "L" should be less than half the grid spacing "d", and "d" is less than the zero bias depletion width $A_O$ associated with the base region.

(4) The spacing "d" between the base region should be about 200 nanometers or less.

Previously, PBT processing has required x-ray lithography to defines a base spacing of 200 nanometers, deposition of a 20nm tungsten grid for the base metal, and the subsequent epitaxial overgrowth of GaAs or Si over the base grid to fabricate the emitter region. These processing steps are rather complex and are not yet suitable for low cost volume production. It would be advantageous to provide a simpler method to fabricate submicron structures in silicon that would allow silicon PBT's and other semiconductor devices to be made without the need of a crystal overgrowth over a patterned metal grid.

SUMMARY OF THE INVENTION

In one aspect of the invention, there is provided a method of fabricating silicon structures for permeable base transistors and other semiconductor devices. A plurality of U-grooves are formed in a surface of a silicon wafer. The sides of the grooves are oxidized consuming some of the silicon near the wall surfaces. The oxide is then stripped off of the walls reducing the thickness of the structure between adjacent walls. The oxidation and stripping is repeated until the structure has the desired thickness.

For a better understanding of the present invention, together with other and further objects, advantages and capabilities thereof, reference is made to the following disclosure and appended claims in connection with the above-described drawings.

DESCRIPTION OF THE INVENTION

According to the invention, submicron silicon structures are fabricated utilizing U-groove etching techniques coupled with repeated oxidation and stripping (ROS). The present process is more economical than previously divulged submicron processes.

Figure 1:
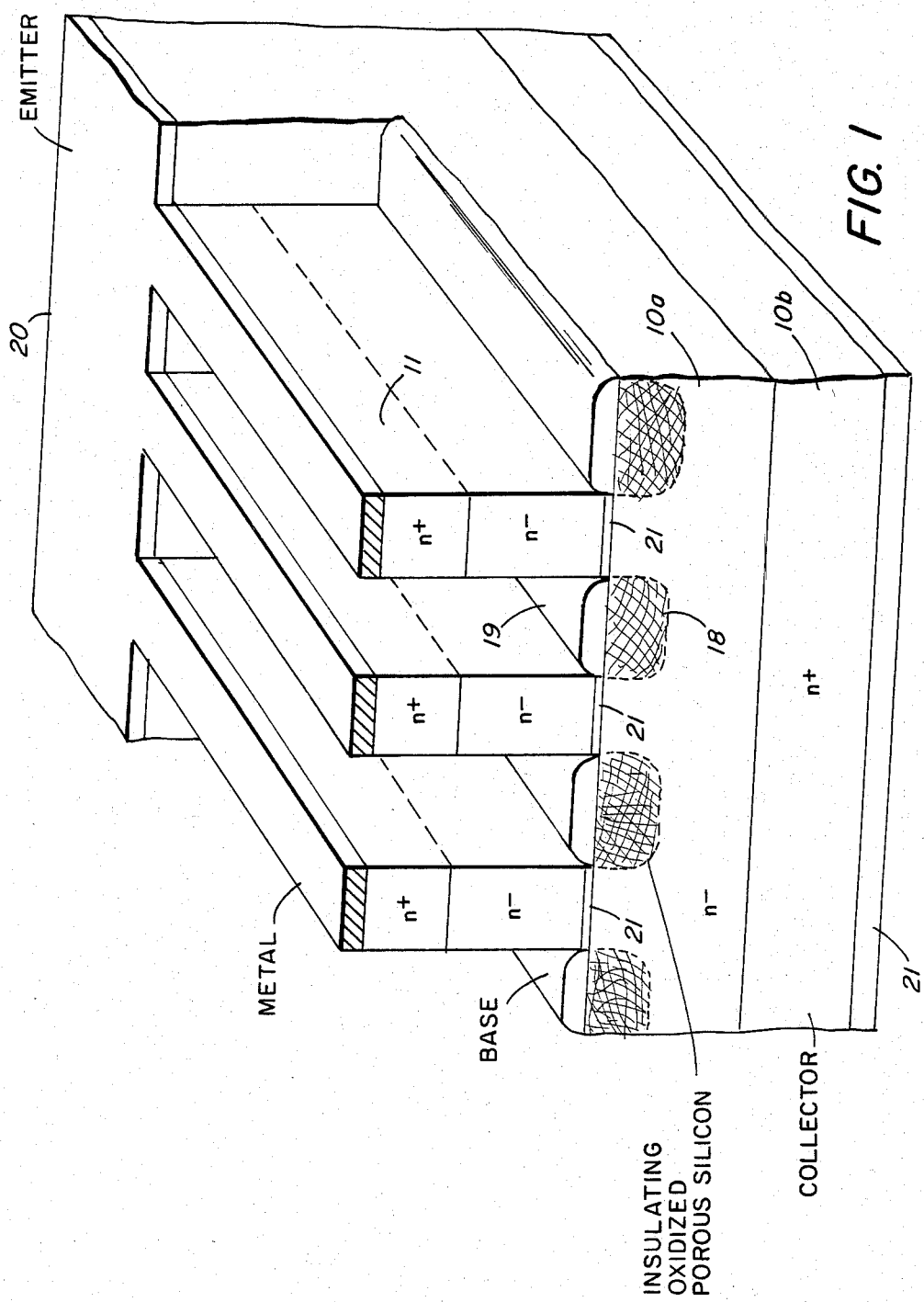
FIG. 1 is a schematic representation of a silicon permeable base transistor embodying one aspect of the invention.
Figure 2:
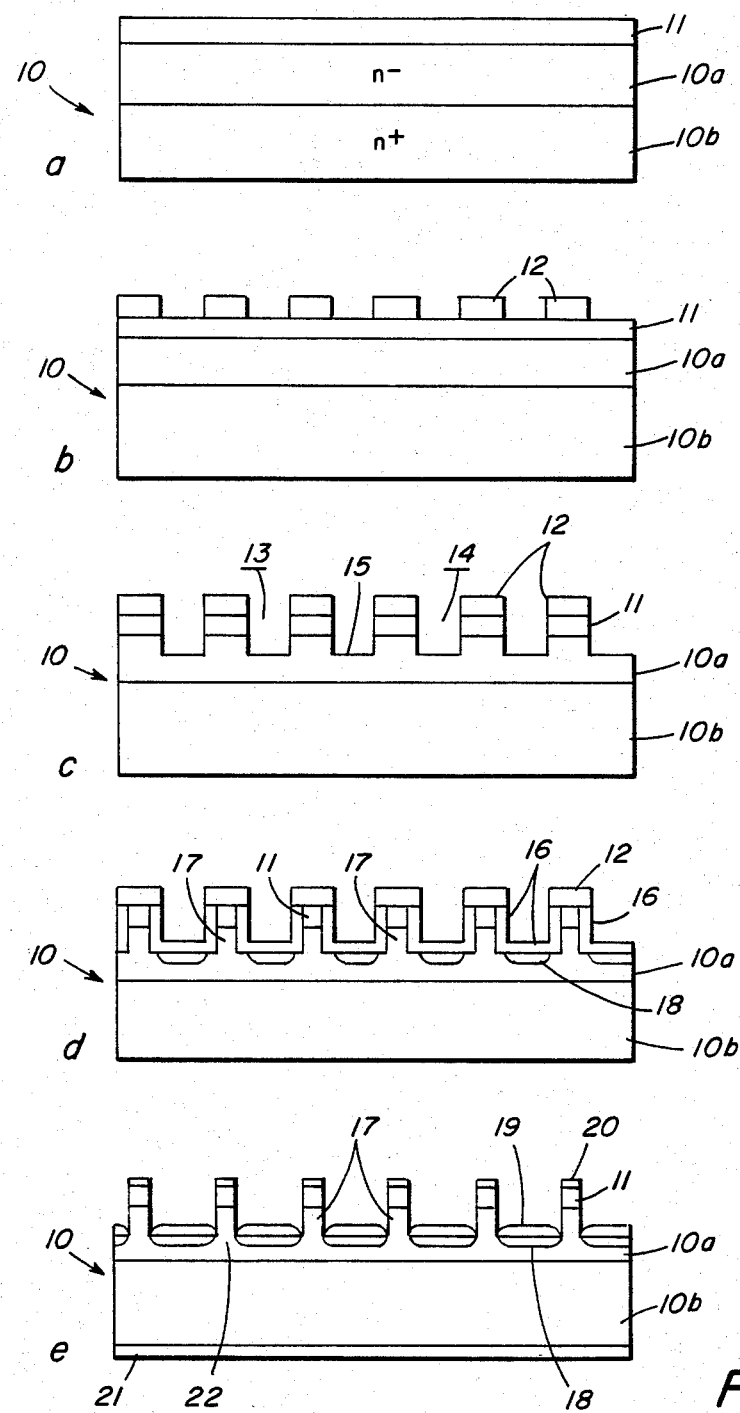
FIGS. 2a–2e illustrate steps during the fabrication of a silicon permeable base transistor as an example of a semiconductor device fabricated by following the method aspect of the invention.

The method may be used to fabricate silicon permeable base transistors (SPBT) with narrow spacings between base regions. The metal base region is isolated from the silicon substrate to reduce parasitic capacitances by the formation of insulating oxidized porous silicon. The structure of a SPBT following the invention is shown in FIG. 1. The procedure to achieve this structure is shown schematically in FIG. 2.

Referring first to FIG. 2a, a silicon wafer 10 has a (110) n− doped (e.g., phosphorus) epitaxial layer 10a on a low resistivity n+ doped (e.g., antimony) substrate 10b oriented in the (110) direction. A silicon nitride or silicon dioxide protective layer is formed on the surface of the epitaxial layer by a known deposition process. Silicon nitride is preferred to silicon dioxide as it is more impervious to some ions which penetrate silicon dioxide. Following known photolithographic techniques the wafer is then masked with a mask aligned in the (111) direction and windows are etched in the oxide.

A high dose n+ type (e.g., arsenic) layer is formed through the windows to form the n+ emitter region 11. The n+ type layer may be formed by any of several known techniques such as ion implantation, diffusion or epitaxial growth.

The windows are then covered with a thin protective layer of silicon nitride (about 100 nanometers) by the known process. The wafer is patterned with a mask of 2 micrometer or smaller lines over the emitter regions 11. The nitride is etched away between the masked emitter fingers 12.

An orientation-dependent chemical etch is used to etch the silicon between the emitter fingers to achieve U-grooves 13 of about 3 micrometers in depth past the emitter region 11 into the n− layer 10a as seen in FIG. 2c. The preferred etchant is a mixture of 44 percent KOH solution at 100° C. (or an equimolar mixture of NiH4 and water), which etches the (111) plane of the (110) epitaxial layer 5 at much higher rates than other planes. Fingers 14 of n− silicon are defined by the walls of adjacent grooves. At this stage of the process, the fingers have approximately the same 2 micrometer or smaller width as the lines on the mask, and are orientated perpendicular to the (111) direction within one degree. In a single transistor a number of fingers and grooves are usually interleaved, as seen in FIG. 1. At this state, however, the fingers are too thick for PBT use and must be thinned by the repeated oxidation and stripping technique of the invention. The basic principle of the ROS thinning technique is that, during the oxidation process, a fixed amount of the silicon is converted into oxide which is then removed in a highly selective etching solution. For very small structure fabrication, the smoothness of the sidewall of the U-groove is critical. Since the rate for the orientation-dependent chemical etching with 44 wt % KOH for different orientation is (111):(100):(110)=1:300:600, the sidewall of the U-groove can be made atomically smooth with no undercut by accurate alignment of the mask.

Before the ROS technique is used, an n type dopant (e.g., P) may be ion-implanted at the bottom 15 of the grooves 13 (FIG. 2c) and in the field regions adjacent to the device (not shown).

The wafer is then placed in an oven with an oxygen and steam atmosphere and oxidized at a temperature of 1050° C. A layer of silicon dioxide 16 is formed on the groove walls of the silicon fingers 14 consuming some of the silicon of the walls. At the same time, the n dopant at the bottom 15 of the grooves will diffuse into the surrounding silicon. The silicon oxide is then stripped away with buffered HF etching solution resulting in thinner silicon fingers 17 and wider grooves. This oxidation and stripping or etching process is repeated until the desired line thickness (grid spacing "d") is obtained (e.g., 80 nanometers).

The oxidation of silicon is well studied; the composition of thermally grown oxides have been reported to be stoichiometric down to within a few angstroms from the interface. The etch rates for standard saturated buffered HF oxide stripping are 800 Å/min for SiO$_2$ and 2–5 Å/min for Si. Thus, the ROS technique can be used to fabricate small structures with excellent thickness control. The width of silicon lines after each oxidation and stripping step is a function of the cumulative oxide thickness grown. Data can be fitted by the equation $w = w_o - 2bt_{ox}$, where $w_o$ is the original width of the U-groove, w is the thickness after each oxidation and stripping, $t_{ox}$ is the thickness of the oxide grown, and b is the ratio of the thickness of the semiconductor consumed to the thickness of oxide grown, which is about 0.44.

ROS is a technique that controls the dimensions in the lateral direction and is basically a subtractive technique in that some of the material is removed to achieve the desired dimension. The earlier technique, on the other hand, is an additive technique; the desired dimension in the vertical direction is achieved by adding material. The precision of both techniques lies in the fact that they can both be done slowly enough to allow precise control. The quality of the resulting material is somewhat better for the ROS technique because the remaining material after ROS is part of the original material. The submicron dimension control achieved by the ROS technique is suitable for the need of the present PBT structures.

The wafer is then subjected to a brief anodic etch in 15% HF to convert the n+ diffused regions at the bottom 15 of the grooves into porous silicon 18 which is rapidly oxidized at a low temperature. The oxidized porous silicon will become the dielectric between the transistor's collector and base regions. The small amount of oxide on the side walls is stripped in a quick buffered HF dip.

After the foregoing repeat oxidation and stripping steps, the silicon nitride (or oxide) mask 12 is stripped from the wafer by a phosphoric acid bath at 180° C. This is necessary as silicon nitride (or oxide) is an electrical insulator and must be removed before electric contact can be made. A metal film (e.g., aluminum or palladium) is then evaporated onto the wafer's horizontal surfaces. Due to the vertical step of the grooves the metal film is discontinuous so as to contact the emitter and base regions separately. Metal in contact with the relatively low doped epitaxial layer at the bottom 15 of the groove forms a Schottky barrier contact 19 at the fingers 17. The metal in contact with the highly doped n epitaxial layer 10a results in an ohmic contact 20. Thus, the emitter ohmic region 20 and the base Schottky junction are formed simultaneously in a self-aligned fashion. Ohmic contact 21 is made to the n+ layer 10b which functions as collector. The resulting structure is depicted in FIG. 2e and in FIG. 1.

The length of channel 22 corresponds to the lateral Schottky contact between the base metal 19 and silicon fingers 17 as determined by the thickness L of the base metal 19 and can be 20 nanometers or less (FIG. 2e). The short channel length results in high frequency operation.

The silicon permeable base transistor following the invention offers the following features:

(1) The narrowness of the channel can be made as small as 40 nanometers or less by repeat oxidation and etching, allowing pinch off at zero bias.

(2) The parasitic capacitance between the base metal 19 and the silicon substrate 10 is minimized by forming a thick layer of insulating oxidized porous silicon 18, which in turn improves the high frequency performance.

(3) Silicon deposition above the base grid is not required.

Thus, there has been described a method of fabricating submicron silicon structures and a silicon permeable base transistor fabricated by said method. Variations of the structure and methods will be apparent. For example, highly anisotropic plasma etching may be used to initially form the grooves before the repeat oxidation and stripping (ROS) step of the process. Therefore, the invention is defined by the claims and not limited by the specific embodiments described.

We claim:

1. A method of fabricating silicon structures, comprised of the following steps:
   a. forming a plurality of U-grooves in a semiconductor wafer with adjacent grooves defining a structure with a width equal to the distance between said grooves;
   b. forming an oxide layer upon the walls of said U-grooves;
   c. stripping said oxide layer from said walls, thereby reducing the width of said structure; and
   d. repeating steps b and c until the desired width of said structure is obtained.

2. The method of claim 1 wherein said structure is one of a plurality of silicon fingers interleaved with said U-grooves.

3. The method of claim 1 wherein the distance between said U-grooves is initially about two micrometers apart and about three micrometers deep and steps b and c are repeated until the width of said structure is less than one micrometer.

4. The method of claim 3 wherein said structure is one of a plurality of silicon fingers interleaved with said U-grooves.

5. The method of claim 3 wherein the width of said structure is about one hundred nanometers.

6. The method of claim 5 wherein said structure is one of a plurality of silicon fingers interleaved with said U-grooves.

7. The method of claim 6 wherein said fingers include the emitter regions of a transistor.

8. The method of claim 7 wherein said transistor is a permeable base transistor.

9. The method of claim 1 wherein said wafer is orientated in the (110) direction and said structure is orientated in the (111) direction.

10. The method of claim 9 wherein said U-groove is formed by orientation-dependent chemical etching.

11. The method of claim 9 wherein said groove is formed by anisotropic plasma etching.

12. A method of fabricating a silicon permeable base transistor, said method comprised of the following steps:
   providing a silicon wafer having an n+ substrate and an n− epitaxial layer;
   providing an n+ layer on top of the n− layer;
   masking the n+ epitaxial layer;
   etching U-grooves through unmasked areas of the n+ layer into the n− layer, said U-grooves separated by silicon fingers;
   implanting and diffusing an n dopant at the bottom of said grooves;
   oxidizing the walls of said grooves to form a layer of silicon dioxide;
   stripping said layer of silicon dioxide to reduce the width of the fingers;
   etching the n+ diffused regions at the bottom of the grooves in order to change said regions into oxidized porous silicon; and
   depositing a metal layer on the bottom of said grooves and on the top of said silicon fingers.

13. The method of claim 12 wherein said n+ layer is formed by implanting an n type dopant in the n− layer.

* * * * *